(12) United States Patent
Kuo et al.

(10) Patent No.: US 10,952,331 B2
(45) Date of Patent: Mar. 16, 2021

(54) WIRE SOLDERED STRUCTURE

(71) Applicant: ALTEK BIOTECHNOLOGY CORPORATION, Hsinchu (TW)

(72) Inventors: Fang-Mentg Kuo, Hsinchu (TW); Te-Yu Chung, Hsinchu (TW); Chao-Yu Chou, Hsinchu (TW)

(73) Assignee: ALTEK BIOTECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/678,401

(22) Filed: Nov. 8, 2019

(65) Prior Publication Data

US 2020/0170122 A1 May 28, 2020

(30) Foreign Application Priority Data

Nov. 28, 2018 (TW) .................................. 107216164

(51) Int. Cl.
*H05K 3/40* (2006.01)
*H01R 12/62* (2011.01)
*H05K 3/34* (2006.01)
*H01R 12/72* (2011.01)
*H05K 1/11* (2006.01)
*H01R 12/58* (2011.01)

(52) U.S. Cl.
CPC .......... *H05K 3/4007* (2013.01); *H01R 12/58* (2013.01); *H01R 12/62* (2013.01); *H01R 12/721* (2013.01); *H05K 1/111* (2013.01); *H05K 3/34* (2013.01)

(58) Field of Classification Search
CPC ........ H05K 3/4007; H05K 1/111; H05K 3/34; H01R 12/58; H01R 12/62; H01R 12/721
USPC .......................................................... 174/250
See application file for complete search history.

(56) References Cited

U.S. PATENT DOCUMENTS

| 4,161,655 | A | * | 7/1979 | Cotic | ...................... | H01J 47/02 |
| | | | | | | 250/385.1 |
| 9,917,370 | B2 | | 3/2018 | McGough et al. | | |
| 2005/0070139 | A1 | * | 3/2005 | Kaneko | ................ | H01R 12/585 |
| | | | | | | 439/82 |

FOREIGN PATENT DOCUMENTS

| CN | 102099873 A | 6/2011 |
| TW | 433655 U | 5/2001 |
| TW | 201112549 A1 | 4/2011 |

* cited by examiner

*Primary Examiner* — Tremesha S Willis
(74) *Attorney, Agent, or Firm* — Li & Cai Intellectual Property (USA) Office

(57) ABSTRACT

A wire soldered structure includes a substrate including a main body, a first conducting layer disposed on the main body, and a through hole extending through the main body and the first conducting layer; a wire including a soldered portion that is disposed on the first conducting layer and that is adjacent to the through hole; and a solder disposed in the through hole; wherein the soldered portion of the wire is soldered to the first conducting layer of the substrate via the solder.

17 Claims, 16 Drawing Sheets

WIRE SOLDERED STRUCTURE

CROSS-REFERENCE TO RELATED PATENT APPLICATION

This application claims the benefit of priority to Taiwan Patent Application No. 107216164, filed on Nov. 28, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a wire soldered structure, and more particularly to a wire soldered structure for soldered a wire on a substrate.

BACKGROUND OF THE DISCLOSURE

Conventionally, when soldered a mesh conductor of a plurality of coaxial cables (also called metallic braid) or wires together with a circuit board, an area of a bonding pad on the circuit board is usually not enough for soldered since the number of the coaxial cables or wires is substantial and the coaxial cables or the wires are packed closely together. The conventional means of solving the aforesaid problem is to increase the area of the bonding pad on the circuit board or to increase space between the coaxial cables or the wires so as to provide enough area of the bonding pad for a soldered torch to perform the soldered (i.e., heating on the bonding pad). It is noted that a heated iron or a laser soldering process can also be applied in other embodiments.

However, electronic devices nowadays are made to be smaller than they were before. As a result of this, a diameter of the coaxial cable is designed to be smaller, as is the circuit board for soldered the coaxial cables thereupon. Consequently, if the circuit board cannot provide enough area of the bonding pad for soldered, a heat conduction path and time for heating will be increased, resulting in a failure of the soldered process between the mesh conductor of the coaxial cables and the bonding pad.

Moreover, if the soldered torch (or the heated iron or the laser soldering process) cannot be applied on the bonding pad, a heating temperature will be unable to reach a required degree in a predetermined period of time. Furthermore, if the soldered torch is directly applied on the mesh conductor of the coaxial cables, a solder will deteriorate due to overheating, incurring a deformation or collapse of the mesh conductor of the coaxial cables. In addition, if the soldered torch is applied for a long period of time, an insulating layer of the mesh conductor of the coaxial cables will be melted, which may result in short circuit of the mesh conductor and a central inner conductor, as well as damage of the coaxial cables.

SUMMARY OF THE DISCLOSURE

In response to the above-referenced technical inadequacies, the present disclosure provides a wire soldered structure.

In one aspect, the present disclosure provides a wire soldered structure including: a substrate including a main body, a first conducting layer disposed on the main body, and a through hole extending through the main body and the first conducting layer; a wire including a soldered portion that is disposed on the first conducting layer and that is adjacent to the through hole; and a solder disposed in the through hole, wherein the soldered portion of the wire is soldered to the first conducting layer of the substrate via the solder.

In certain embodiments, the present disclosure provides a wire soldered structure, wherein a longitudinal direction of the soldered portion of the wire is perpendicular to an extending direction of the through hole.

In one aspect, the present disclosure provides a wire soldered structure including: a substrate including a main body, a first conducting layer disposed on the main body, a second conducting layer disposed on the main body and opposite to the first conducting layer, a through hole extending through the main body and the first conducting layer, and a third conducting layer that is disposed in the through hole and that is connected between the first conducting layer and the second conducting layer; a wire including a soldered portion that is disposed on the first conducting layer and that is adjacent to the through hole; and a preset solder disposed on at least one of the soldered portion of the wire and the first conducting layer of the substrate, wherein the soldered portion of the wire is soldered to the first conducting layer of the substrate via the preset solder.

In certain embodiments, the present disclosure provides a wire soldered structure, wherein a longitudinal direction of the soldered portion of the wire is perpendicular to an extending direction of the through hole Therefore, one of the beneficial effects of the present disclosure is that: by virtue of the features of "the soldered portion of the wire is disposed on the first conducting layer and adjacent to the through hole" and "the soldered portion of the wire is soldered to the first conducting layer of the substrate via the solder or the preset solder" of the wire soldered structure provided by the present disclosure, the reliability of the soldered effect between the wires and the substrate can be substantially increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
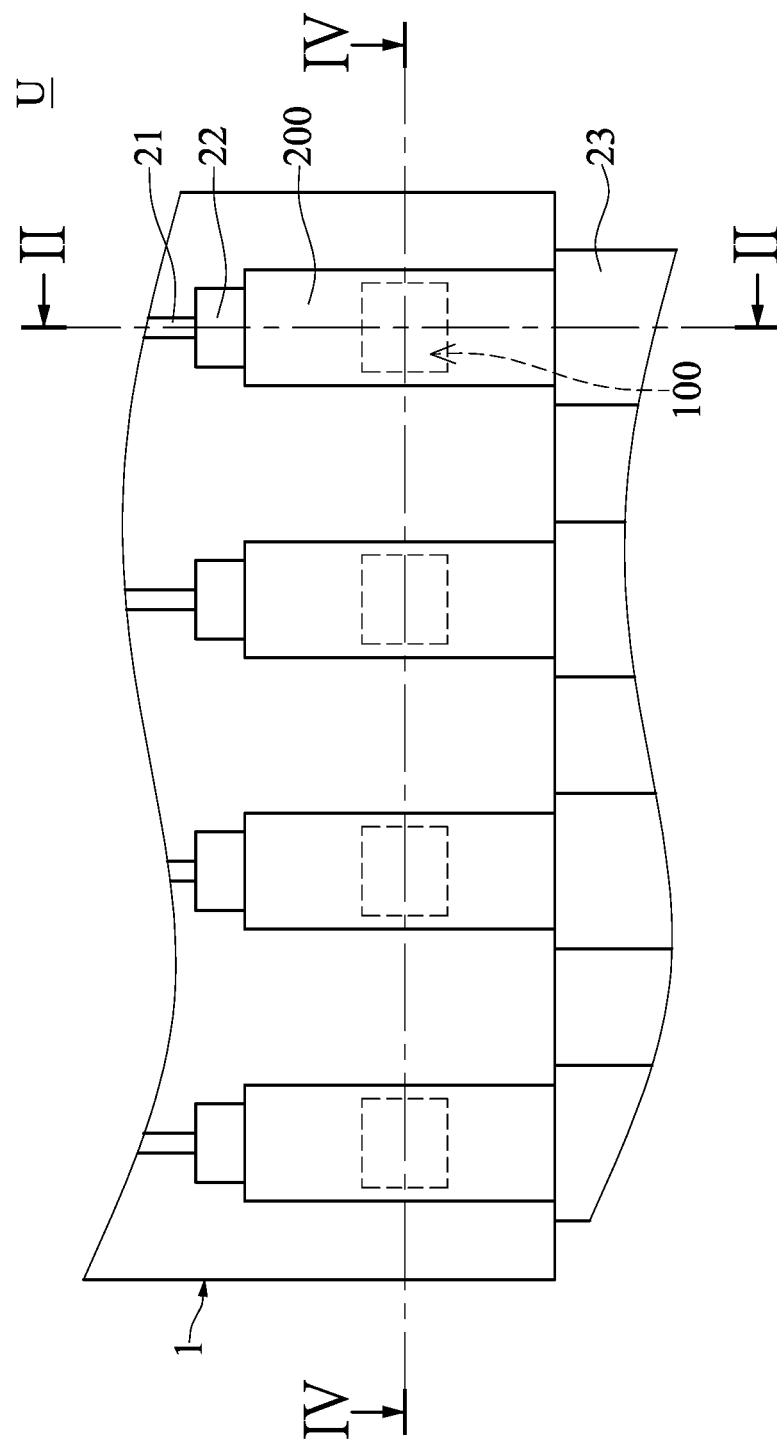
FIG. 1 is a top view of a wire soldered structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
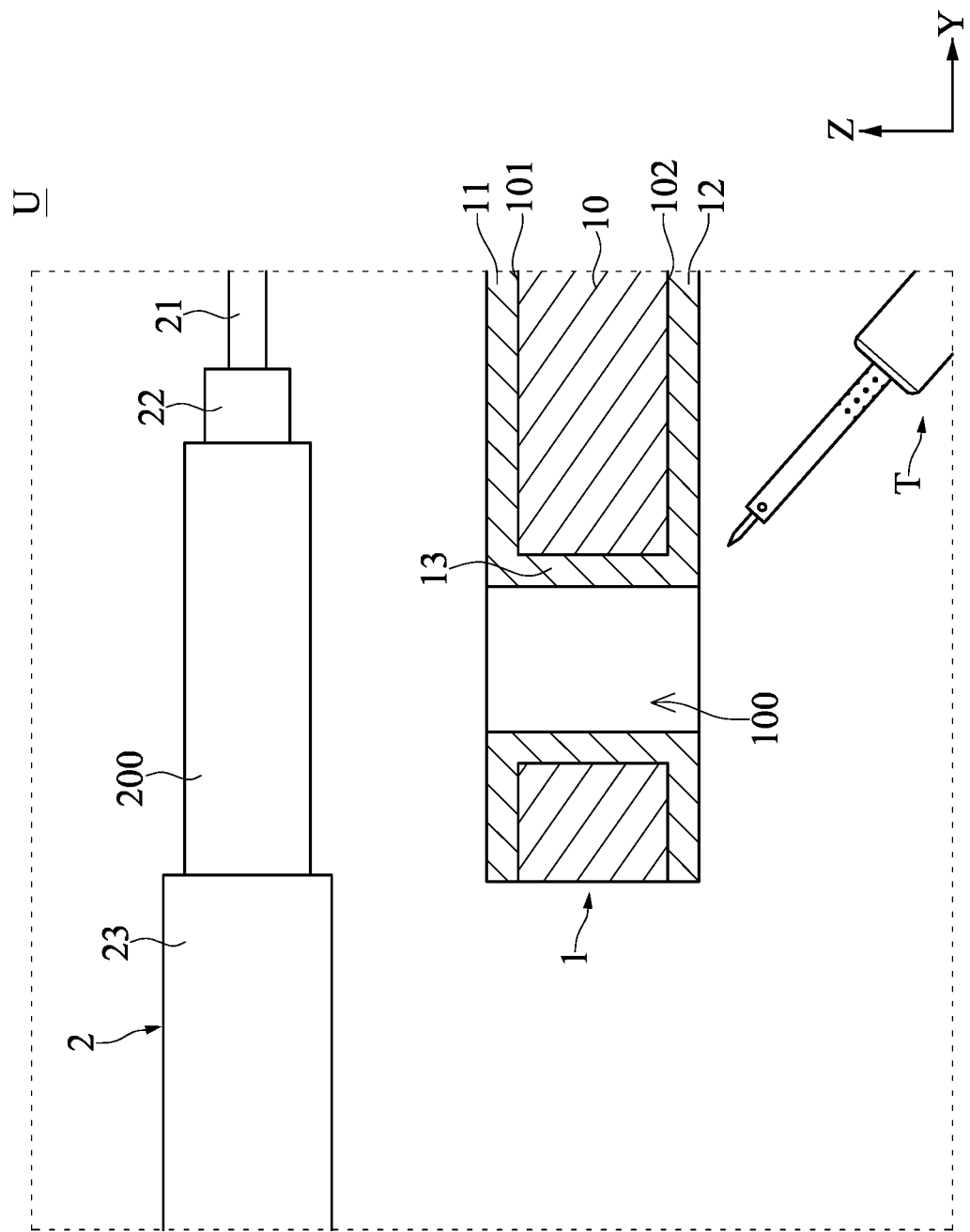
FIG. 2 is an exploded cross-sectional view of a wire and a substrate taken along line II-II of FIG. 1.
Figure 3:
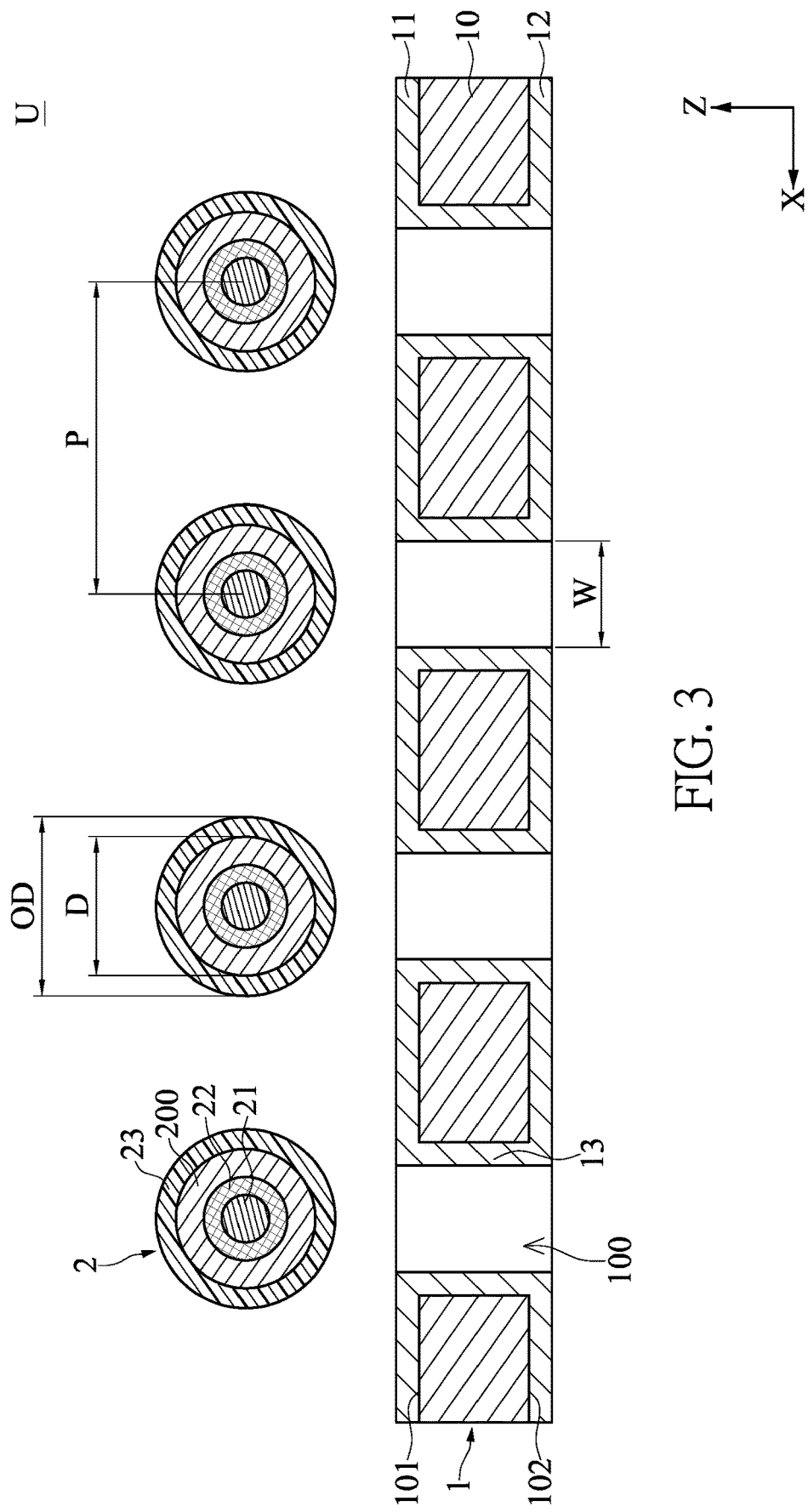
FIG. 3 is an exploded cross-sectional view of the wire and the substrate taken along line IV-IV of FIG. 1.
Figure 4:
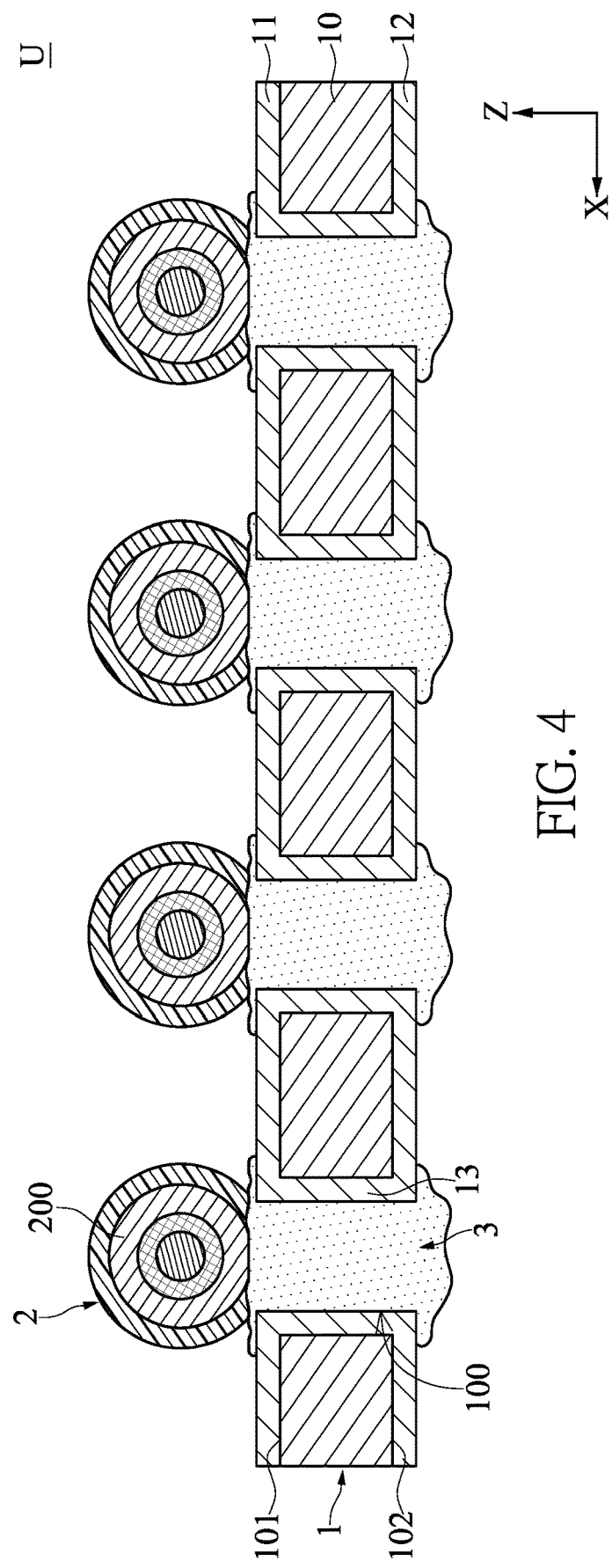
FIG. 4 is a cross-sectional view taken along line IV-IV of FIG. 1.

Referring to FIG. 1 to FIG. 3, FIG. 1 is a top view of a wire soldered structure according to a first embodiment of the present disclosure. FIG. 2 is an exploded cross-sectional view of a wire and a substrate taken along line II-II of FIG. 1. FIG. 3 is an exploded cross-sectional view of the wire and the substrate taken along line IV-IV of FIG. 1. The first embodiment of the present disclosure provides a wire soldered structure U. The wire soldered structure U includes a substrate 1 and a wire 2. The wire 2 can be soldered to the substrate 1 via a solder 3 (as shown in FIG. 4). Moreover, the wire 2 provided by embodiments of the present disclosure will be exemplified as a coaxial cable, and the soldered process will be exemplified as soldered a mesh conductor of a plurality of coaxial cables (also called a metallic braid or an outer conductor) to the substrate 1. With that being said, the coaxial cable in the figures can include an inner conductor 21, an insulating layer 22, a mesh conductor (i.e., a soldered portion 200 of the wire) and an outer covering layer 23. However, in other embodiments, the wire 2 can also be other wires that require soldered, for example, but not limited to, a solid conductor or a stranded conductor. The wire of the present disclosure is not limited to any specific type. Moreover, the substrate can be a printed circuit board (PCB) or a flexible printed circuit board (FPCB), but will not be limited thereto.

As mentioned above, referring back to FIG. 1 to FIG. 3, the substrate 1 can include a main body 10, a first conducting layer 11 disposed on the main body 10, and one or more through holes 100 extending through the main body 10 and the first conducting layer 11. Specifically, the substrate 1 further includes a second conducting layer 12, and a third conducting layer 13 that is disposed in the through hole 100 and that is connected between the first conducting layer 11 and the second conducting layer 12, in which the through hole 100 extends through the second conducting layer 12 as well. To be more specific, the main body 10 of the substrate 1 includes a first surface 101 and a second surface 102 opposite to the first surface 101. The first conducting layer 11 can be disposed on the first surface 101, and the second conducting layer 12 is disposed on the second surface 102. In other words, in one aspect of this embodiment, the first and second conducting layers 11, 12 can be respectively disposed on a bonding pad or a metal layer of the main body 10 of the substrate 1. The third conducting layer 13 can be electrically connected to vias that are respectively disposed on the first conducting layer 11 and the second conducting layer 12 opposite to the first conducting layer 11 of the main body 10 of the substrate 1. In addition, it should be noted that the first conducting layer 11, the second conducting layer 12 and the third conducting layer 13 can also have good thermal-conducting properties.

As mentioned above, referring back to FIG. 1 to FIG. 3, the wire 2 can include a soldered portion 200. The soldered portion 200 is disposed on the first conducting layer 11 and is adjacent to the through hole 100. Preferably, a projection of the soldered portion 200 of the wire 2 on the first surface 101 of the substrate 1 at least partially overlaps with a projection of the through hole 100 on the first surface 101 of the substrate 1. That is, as shown in FIG. 1 to FIG. 3, the projection of the soldered portion 200 at least partially overlaps with the projection of the through hole 100 on an X-Y plane. Further, in the aspect of FIG. 1 to FIG. 3, the soldered portion 200 of the wire 2 corresponds to the through hole 100. Accordingly, the soldered portion 200 of the wire 2 is disposed right above the through hole 100, but is not limited thereto.

As mentioned above, referring back to FIG. 1 to FIG. 3, a longitudinal direction of the soldered portion 200 of the wire 2 (i.e., the Y direction along the XYZ axis) can be configured to be perpendicular to an extending direction of the through hole 100 (i.e., the Z direction). In other words, compared with the conventional soldered method of the solid conductor, the soldered portion 200 of the wire 2 of the present disclosure will not penetrate from an upper surface to a lower surface of the substrate 1. Furthermore, the soldered portion 200 of the wire 2 has a predetermined outer diameter D. The through hole 100 has a predetermined diameter W. The predetermined outer diameter D and the predetermined diameter W satisfy the following equation: $0.5\ D \leq W \leq 1.5\ D$, in which D is the predetermined outer diameter, and W is the predetermined diameter.

Moreover, the outer covering layer 23 has a predetermined wire diameter OD. A center (not marked in figures) of the wire 2 is spaced apart from a center (not marked in figures) of another wire 2 by a spaced distance P. The predetermined wire diameter OD and the spaced distance P satisfy the following equation: $OD \leq P \leq 2\ OD$, in which OD is the predetermined wire diameter, and P is the length of the spaced distance. Furthermore, the predetermined diameter W and the spaced distance P satisfy the following equation: $0.7\ P \leq W \leq 1.6\ P$, in which P is the length of the spaced distance, and W is the predetermined diameter. Specifically, the wire soldered structure U of the present disclosure is preferably applied in a configuration where the wire 2 with the outer covering layer 23 having a predetermined wire diameter OD ranges from 0.25 millimeter (mm) to 0.8 mm.

It should be noted that even though the through hole 100 is shown to be square-shaped in the figures, the shape of the through hole 100 in other embodiments of the present disclosure can also be round, rectangular, or oval, and not be limited thereto. In addition, the through hole 100 can be configured at the sides of the substrate 1, such that the through hole 100 is configured to be in the form of a groove.

Further, referring to FIG. 4, a cross-sectional view taken along line IV-IV of FIG. 1 is shown. That is, FIG. 4 shows a structure after soldered the soldered portion 200 of the wire 2 to the first conducting layer 11 of the substrate 1 via the solder 3 (e.g., solder paste, but not limited thereto). Specifically, the soldered portion 200 of the wire 2 is pressed against the first conducting layer 11 of the substrate 1. Then, the solder 3 can be heated and melted by a soldered torch T (or a heated iron), and thus be applied within the through hole 100, such that the melted solder 3 can move along the +Z direction from the second surface 102 of the substrate 1 toward the first surface 101 of the substrate 1. Moreover, the melted solder 3 can pass through the third conducting layer 13 disposed in the through hole 100 and finally move to the first conducting layer 11 and the soldered portion 200 of the wire 2. As a result, after the melted solder 3 is solidified, the solder 3 can be configured on the third conducting layer 13 in the through hole 100, and also, the first conducting layer 11 can be bonded to, via the solder 3, and electrically connected to the soldered portion 200 of the wire 2. In other words, taking the first embodiment of the present disclosure for example, a direction that the solder 3 is applied to the substrate 1 is opposite to a direction that the wire 2 is disposed on the substrate 1. That is to say, by virtue of the configuration of the through hole 100 of the first embodiment of the present disclosure, the solder 3 can move from the opposite side of the wire 2 to a position between the soldered portion 200 and the first conducting layer 11 so as to bond (fix) the wire 2 to the substrate 1.

It should be further noted that the abovementioned application of the soldered torch T (or a heated iron) is only an example in the first embodiment of the present disclosure, and a laser soldering process or drag soldering process can also be applied in other embodiments, the present disclosure not being limited thereto. It should also be noted that in the aspect of FIG. 1 to FIG. 4, the soldered portion 200 of the wire 2 corresponds to the through hole 100. Accordingly, the predetermined wire diameter OD and the spaced distance P preferably satisfy the following equation: $OD \leq P \leq 1.25\ OD$.

As mentioned above, in terms of the soldered process of the wire soldered structure of the first embodiment of the present disclosure, the substrate 1 having the through hole 100 can be first provided. Then, the soldered portion 200 of the wire 2 can be disposed at the first conducting layer 11 on the first surface 101 of the substrate 1, where the through hole 100 is configured to correspond thereto. Finally, the soldered torch T can be applied to melt the solder 3 such that the melted solder 3 can pass through the through hole 100 from the second conducting layer 12 on the second surface 102 of the substrate 1 to flow to the position between the soldered portion 200 and the first conducting layer 11 so as to bond (fix) the soldered portion 200 to the first conducting later 11.

Figure 5:
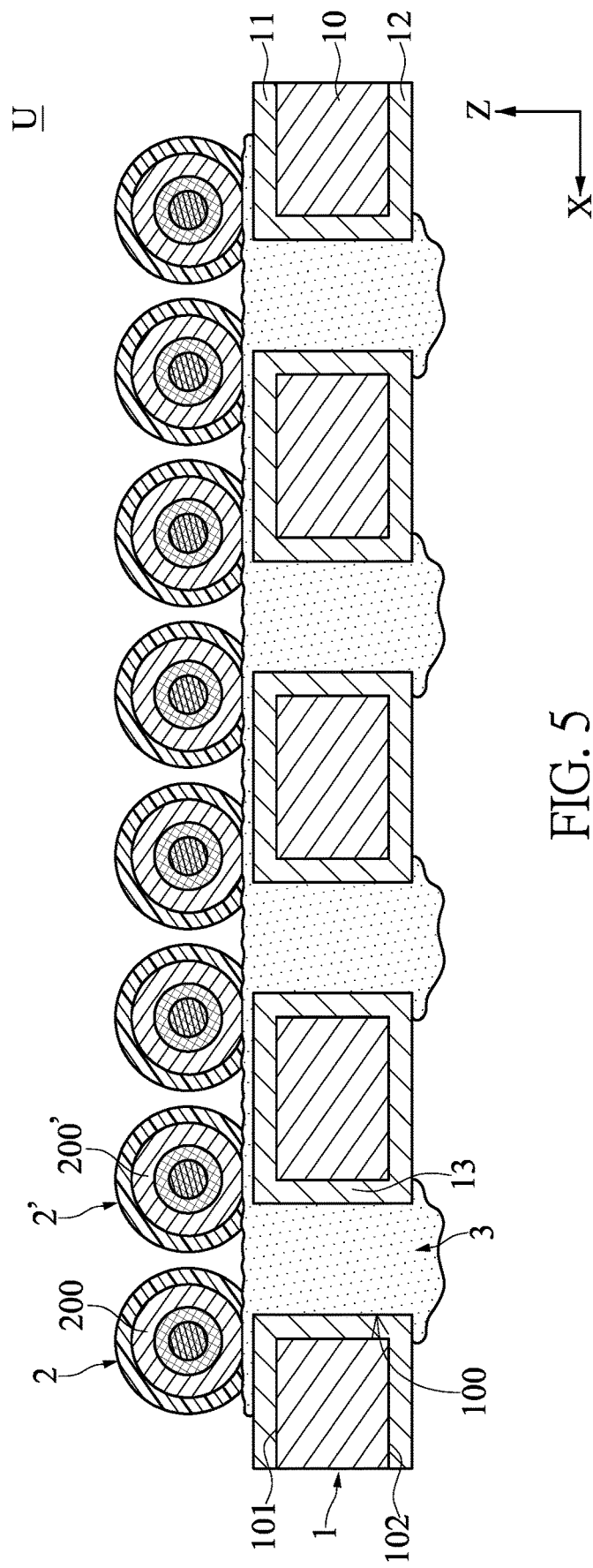
FIG. 5 is a cross-sectional view of another aspect of the wire soldered structure according to the first embodiment of the present disclosure.

Referring to FIG. 5, a cross-sectional view of another aspect of the wire soldered structure according to the first embodiment of the present disclosure is shown. Comparing FIG. 4 with FIG. 5, the wire soldered structure U of the FIG. 5 can further include another wire 2'. Specifically, the another wire 2' is disposed to be adjacent to the wire 2. The another wire 2' further includes another soldered portion 200'. The another soldered portion 200' can be disposed on the first conducting layer 11 and to be adjacent to the through hole 100. Preferably, the through hole 100 can be configured between the soldered portion 200 of the wire 2 and the another soldered portion 200' of the another wire 2'.

In other words, in the aspect shown in FIG. 5, two of the wires 2 can share the same through hole 100, but is not limited thereto. In other embodiments of the present disclosure, multiple ones of the wires 2 can also share the same through hole 100. In addition, regarding the aspect shown in FIG. 5, since the multiple wires 2, 2' can be simultaneously soldered to the substrate 1, a flexible flat cable (or called ribbon cable) formed by the multiple wires 2, 2' can also be applied on this embodiment of the present disclosure. Moreover, it should be noted that in the aspect shown in FIG. 5, the soldered portions 200, 200' of the multiple wires 2, 2' is configured to correspond to the through hole 100. Accordingly, the predetermined wire diameter OD and the spaced distance P preferably satisfy the following equation: $1.25\ OD \leq P \leq 2\ OD$.

Figure 6:
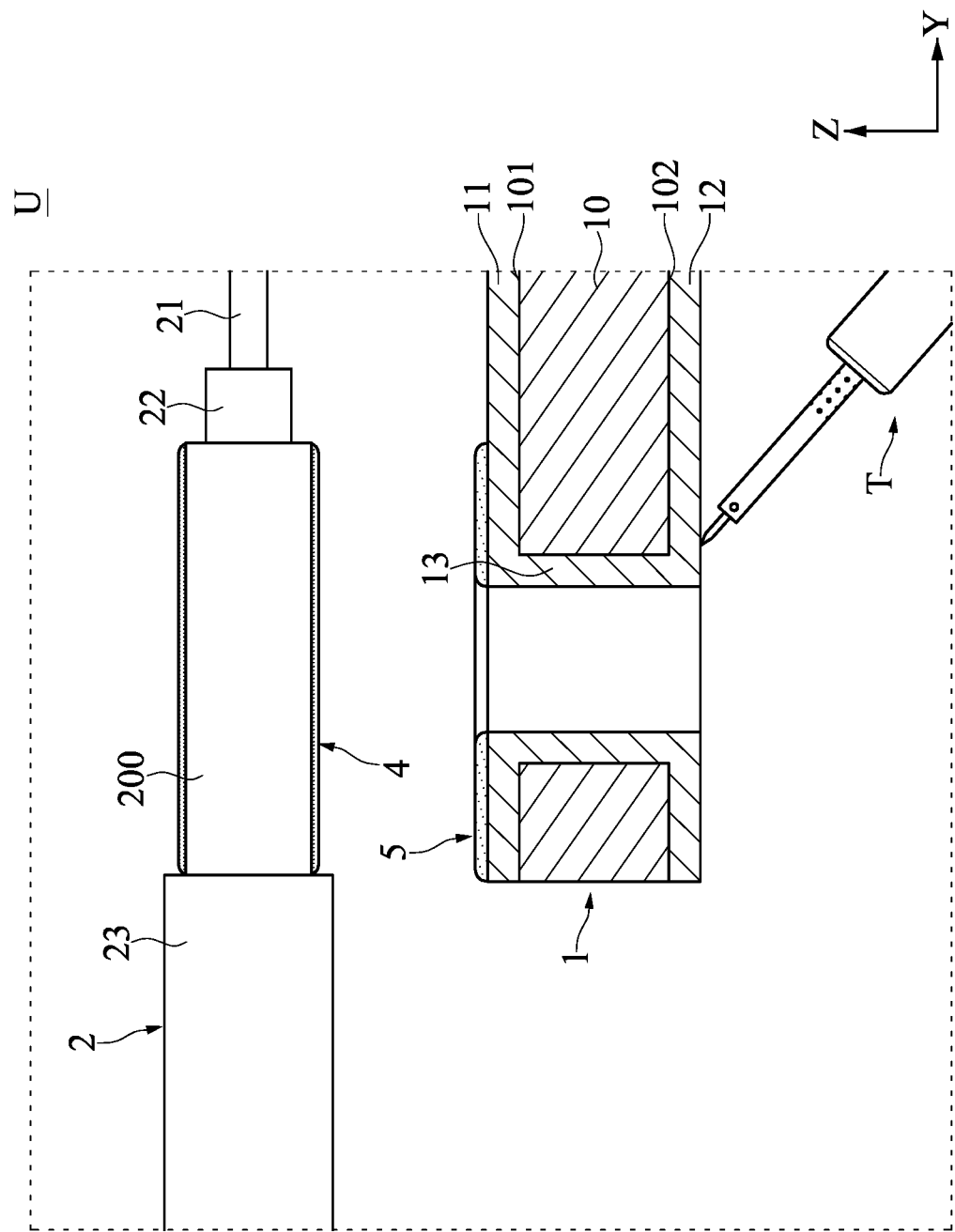
FIG. 6 is an exploded cross-sectional view of the wire and the substrate of yet another aspect of the wire soldered structure according to the first embodiment of the present disclosure.
Figure 7:
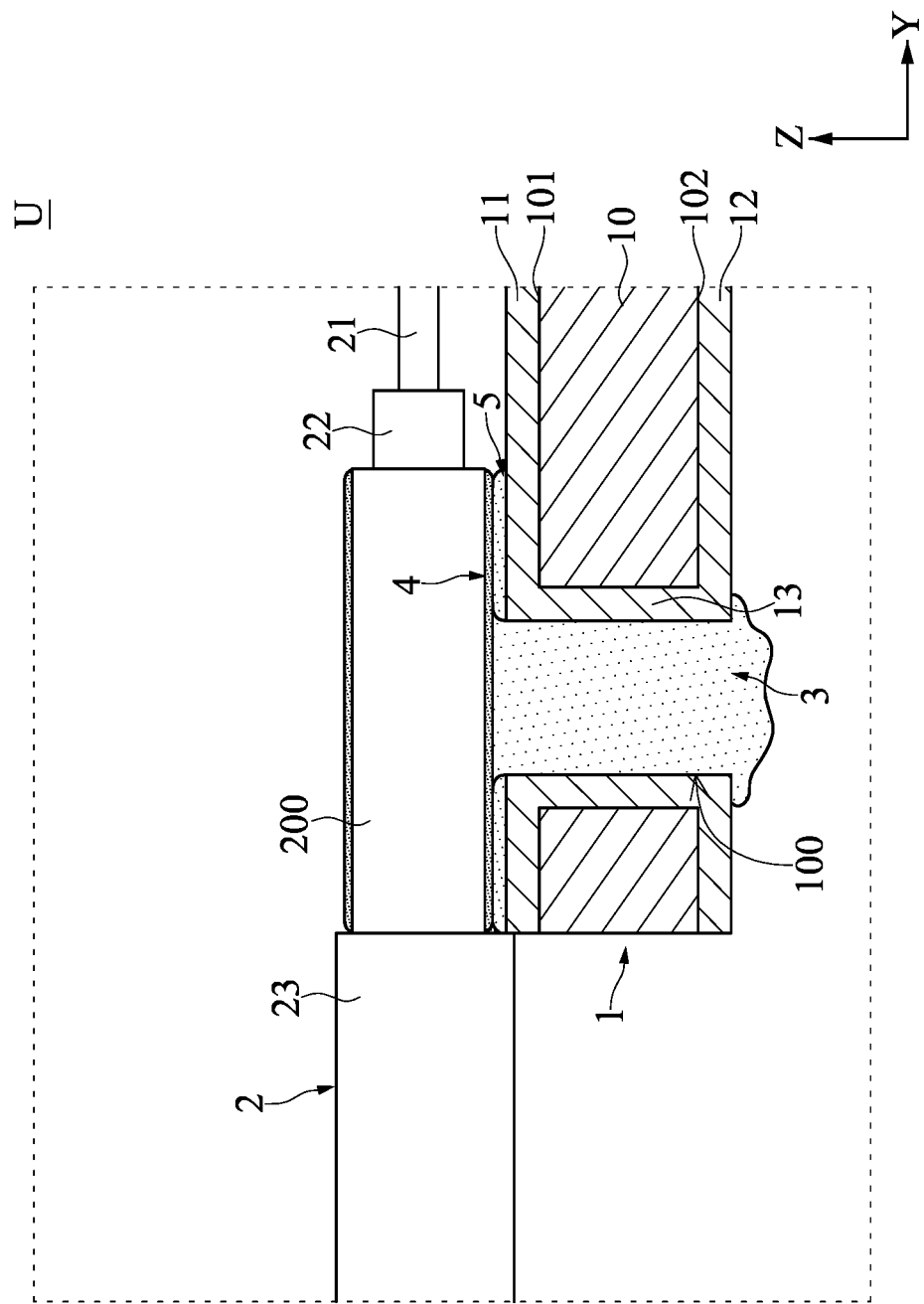
FIG. 7 is a cross-sectional view of yet another aspect of the wire soldered structure according to the first embodiment of the present disclosure.

Further, referring to FIG. 6 and FIG. 7, an exploded cross-sectional view of the wire and the substrate of yet another aspect of the wire soldered structure according to the first embodiment of the present disclosure and a cross-sectional view of yet another aspect of the wire soldered structure according to the first embodiment of the present disclosure are shown. Comparing FIG. 6 with FIG. 2, regarding the aspect shown in FIG. 6 and FIG. 7, the wire soldered structure U can further include a preset solder (a first preset solder 4 and/or a second preset solder 5, for example but not limited to the solder plate). The preset solder can be disposed on at least one of the soldered portion 200 of the wire 2 and the first conducting layer 11 of the substrate 1. In other words, before disposing the solder 3 into the through hole 100, the first preset solder 4 can be disposed on the soldered portion 200 of the wire 2, or the second preset solder 5 can be disposed on the first conducting layer 11 of the substrate 1. Specifically, when the soldered portion 200 is bonded to the first conducting layer 11 via the solder 3 melted by the soldered torch T, the soldered torch T can be pressed against the second conducting layer 12 or the third conducting layer 13. Consequently, a heat generated by the soldered torch T can be sequentially conducted through the second conducting layer 12 or the third conducting layer 13, and to the first conducting layer 11. Therefore, the first preset solder 4 disposed on the soldered portion 200 of the wire 2 and/or the second preset solder 5 disposed on the first conducting layer 11 of the substrate 1 can also be heated and melted. As a result, after the melted first preset solder 4 and/or the second preset solder 5 are solidified, a bonding force between the first conducting layer 11 of the substrate 1 and the soldered portion 200 of the wire 2 can be increased. Further, it should be noted that although the aspect shown in FIG. 6 and FIG. 7 includes the solder 3, the first preset solder 4 and the second preset solder 5 at the same time, the first preset solder 4 and the second preset solder 5 can be selectively disposed in other embodiments of the present disclosure.

Figure 8:
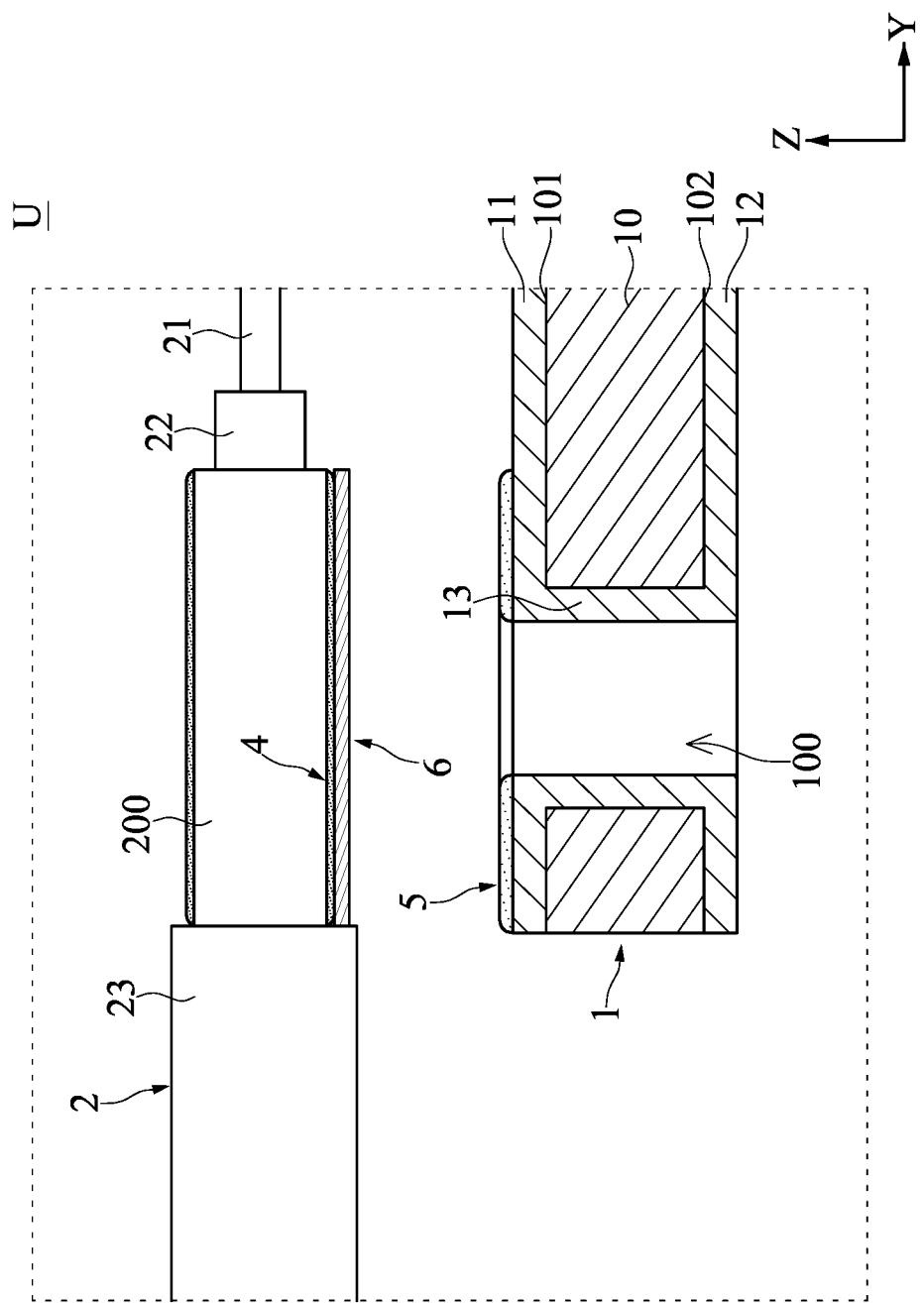
FIG. 8 is an exploded cross-sectional view of the wire and the substrate of still another aspect of the wire soldered structure according to the first embodiment of the present disclosure.
Figure 9:
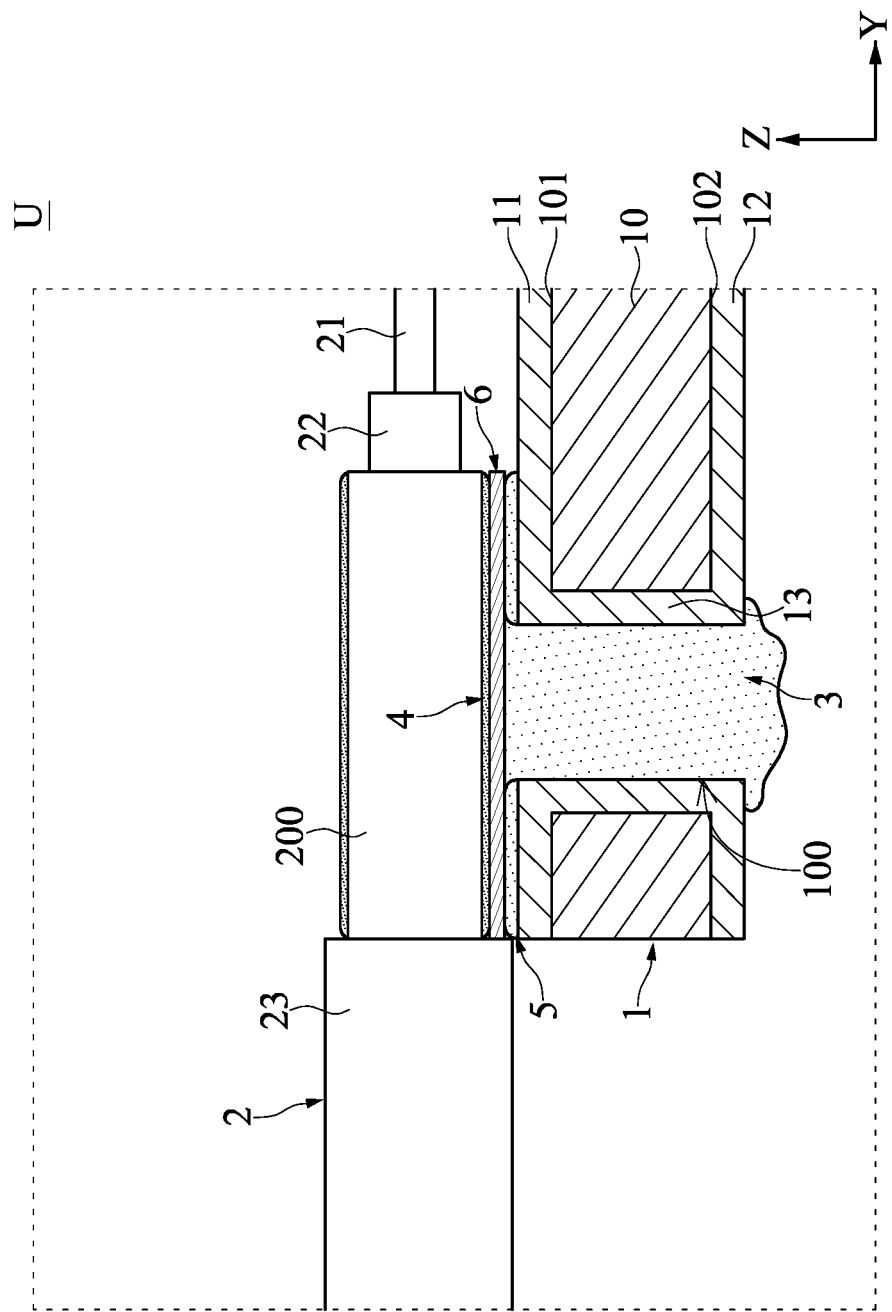
FIG. 9 is a cross-sectional view of still another aspect of the wire soldered structure according to the first embodiment of the present disclosure.
Figure 10:
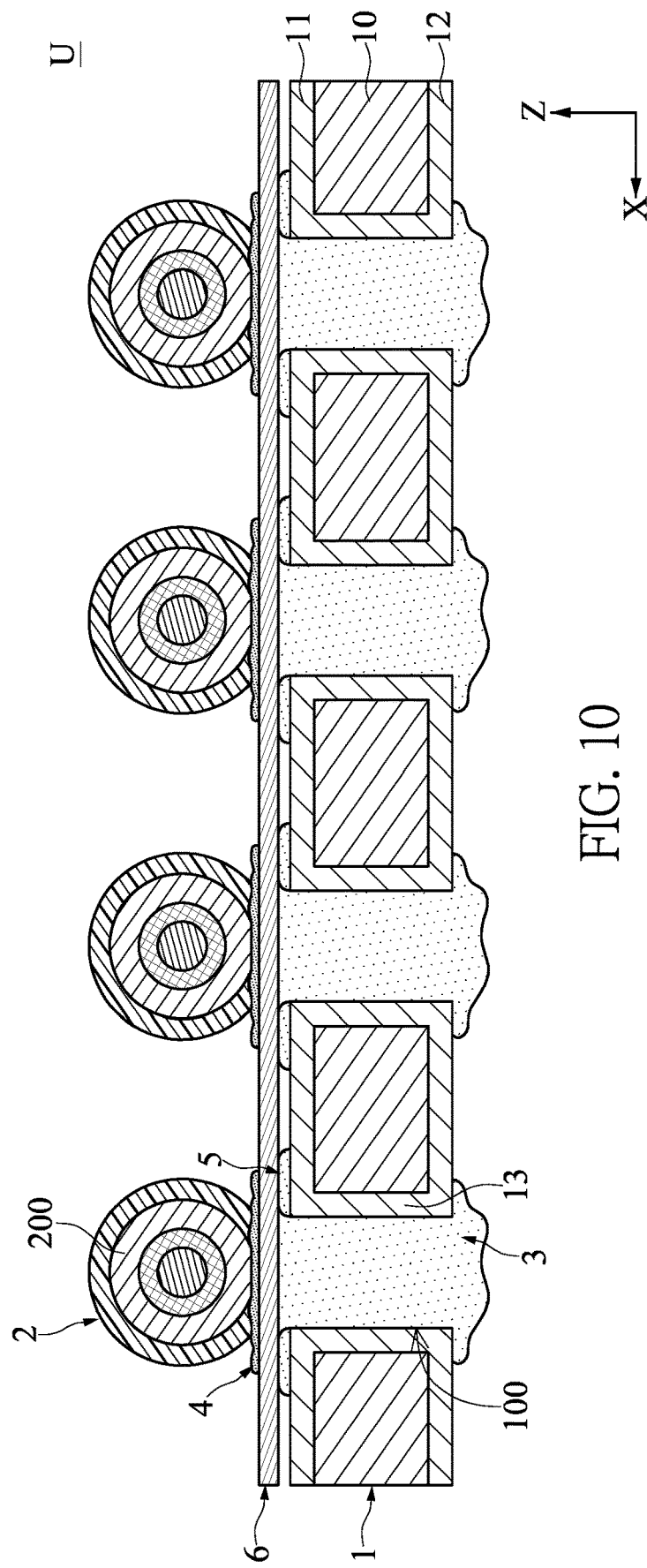
FIG. 10 is another cross-sectional view of still another aspect of the wire soldered structure according to the first embodiment of the present disclosure.

Referring to FIG. 8 to FIG. 10, an exploded cross-sectional view of the wire and the substrate of still another aspect of the wire soldered structure according to the first embodiment of the present disclosure, a cross-sectional view of still another aspect of the wire soldered structure according to the first embodiment of the present disclosure, another cross-sectional view of still another aspect of the wire soldered structure according to the first embodiment of the present disclosure are shown. Comparing FIG. 8 with FIG. 6, the wire soldered structure U shown in FIG. 8 to FIG. 10 can further include a conductive plate 6. The first preset solder 4 can be disposed on the soldered portion 200 of the wire 2, and can be disposed between the soldered portion 200 of the wire 2 and the conductive plate 6. Therefore, the soldered portion 200 of the wire 2 is soldered to the conductive plate 6 via the first preset solder 4. In other words, the first preset solder 4 can be disposed on the soldered portion 200 of the wire 2 for soldered the conductive plate 6 on the soldered portion 200 of one or more of the wires 2. Then, the second preset solder 5 can also be disposed on the first conducting layer 11 of the substrate 1 before disposing the solder 3 in the through hole 100. Specifically, when the soldered portion 200 is bonded to the first conducting layer 11 via the solder 3 melted by the soldered torch T, the soldered torch T can be pressed against the second conducting layer 12 or the third conducting layer 13. Consequently, a heat generated by the soldered torch T can be sequentially conducted through the second conducting layer 12 or the third conducting layer 13, and to the first conducting layer 11. Therefore, the second preset solder 5 disposed on the first conducting layer 11 of the substrate 1 can also be heated and melted. As a result, after the melted second preset solder 5 is solidified, a bonding force between the first conducting layer 11 of the substrate 1 and the conductive plate 6 can be increased.

Further, it should be noted that since the aspect of the wire soldered structure U shown in FIG. 8 to FIG. 10 further includes the conductive plate 6 soldered on the soldered portion 200 of the wire 2, the soldered portion 200 of the wire 2 can be protected from being continuously heated and being damaged. Meanwhile, the conductive plate 6 can fix a position of the wire 2, relative to the substrate 1. Furthermore, it should be noted that although the aspect shown in FIG. 8 to FIG. 10 includes the solder 3, the first preset solder 4 and the second preset solder 5 at the same time, the second preset solder 5 can be selectively disposed or not disposed at all in other embodiments of the present disclosure.

Figure 11:
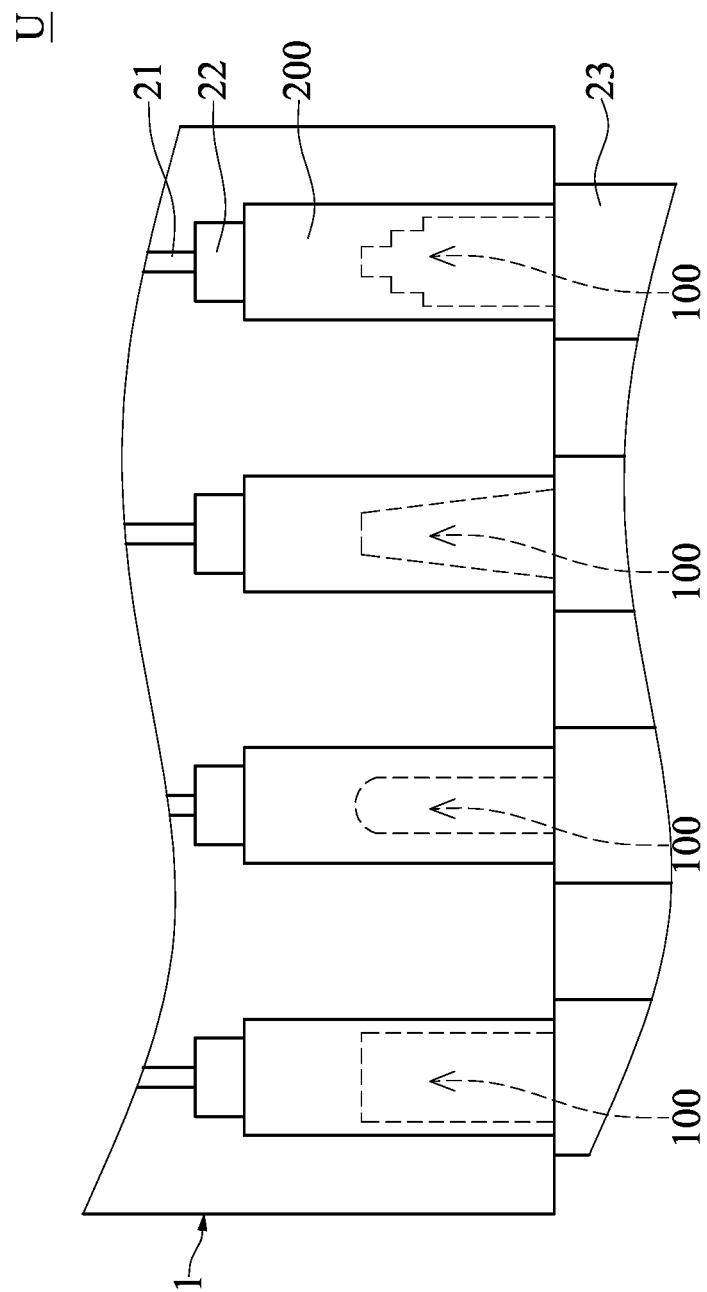
FIG. 11 is a top view of another aspect of the wire soldered structure according to the first embodiment of the present disclosure.

Referring to FIG. 11, a top view of another aspect of the wire soldered structure according to the first embodiment of the present disclosure is shown. Comparing FIG. 11 with FIG. 1, the through hole 100 can also be configured at the sides of the substrate 1, such that the through hole 100 is configured to be in the form of a groove. However, the shape of the groove in other embodiments of the present disclosure can also be rectangular, U-shaped, a trapezoid, or jagged, but is not limited thereto.

Figure 12:
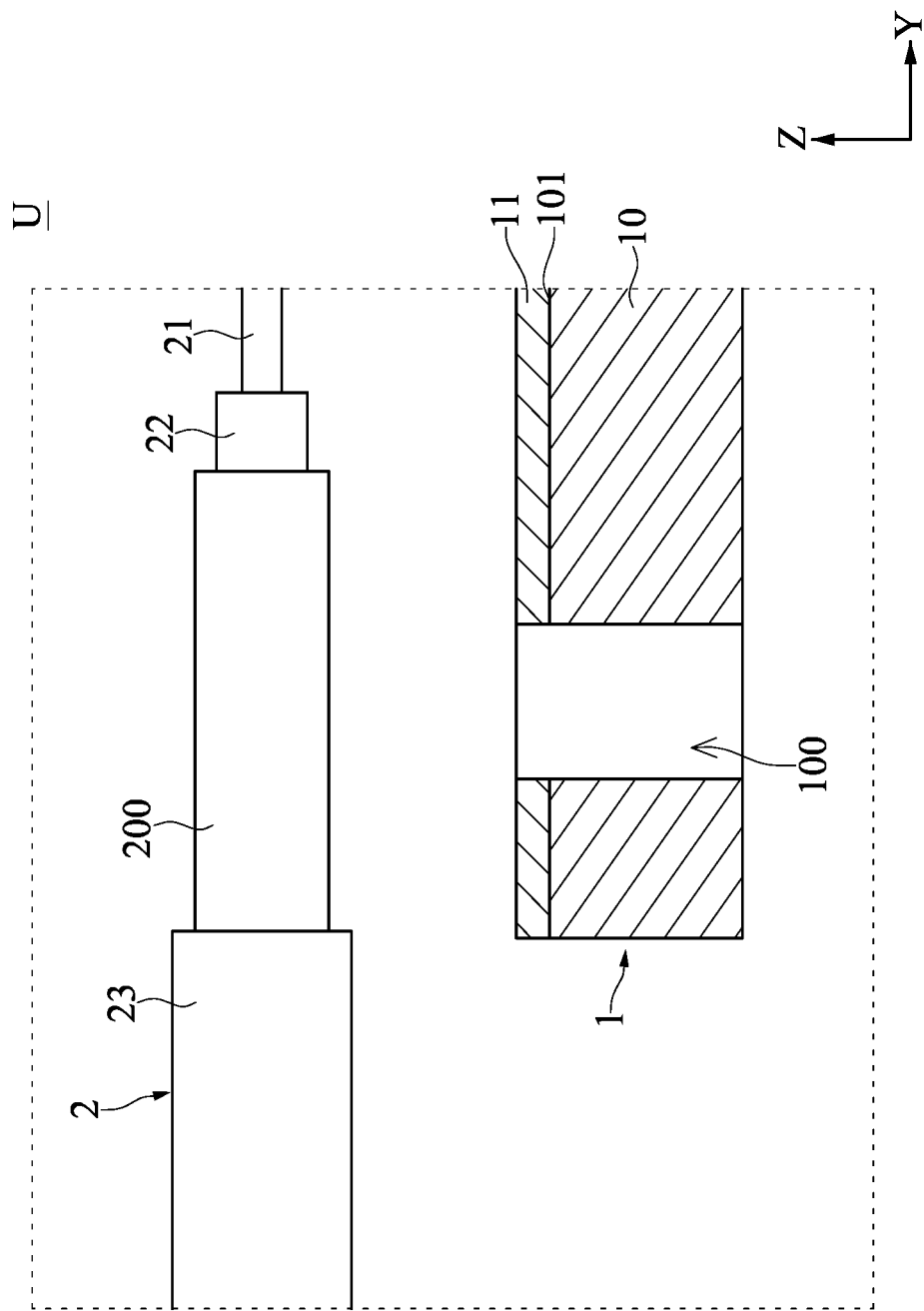
FIG. 12 is an exploded cross-sectional view of the wire and the substrate of another aspect of the wire soldered structure according to the first embodiment of the present disclosure.

Further, referring to FIG. 12, an exploded cross-sectional view of the wire and the substrate of another aspect of the wire soldered structure according to the first embodiment of the present disclosure is shown. Comparing FIG. 12 with FIG. 2, the second conducting layer 12 and the third conducting layer 13 are not disposed on the substrate 1 in the aspect of the wire soldered structure U shown in FIG. 12. That is to say, the second conducting layer 12 and the third conducting layer 13 can be selectively disposed or not disposed at all in other embodiments of the present disclosure.

Second Embodiment

Figure 13:
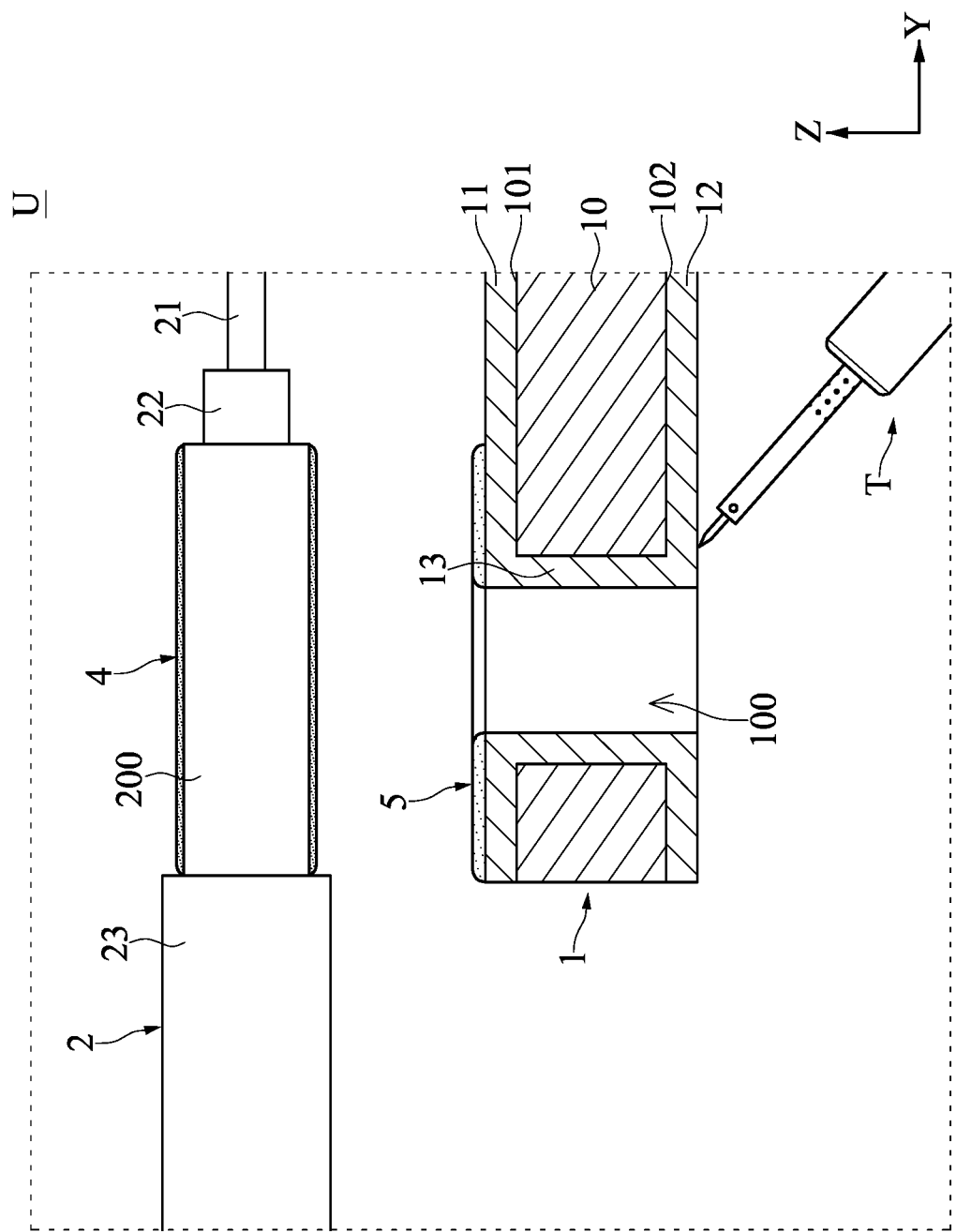
FIG. 13 is an exploded cross-sectional view of the wire and the substrate of another aspect of the wire soldered structure according to a second embodiment of the present disclosure.
Figure 14:
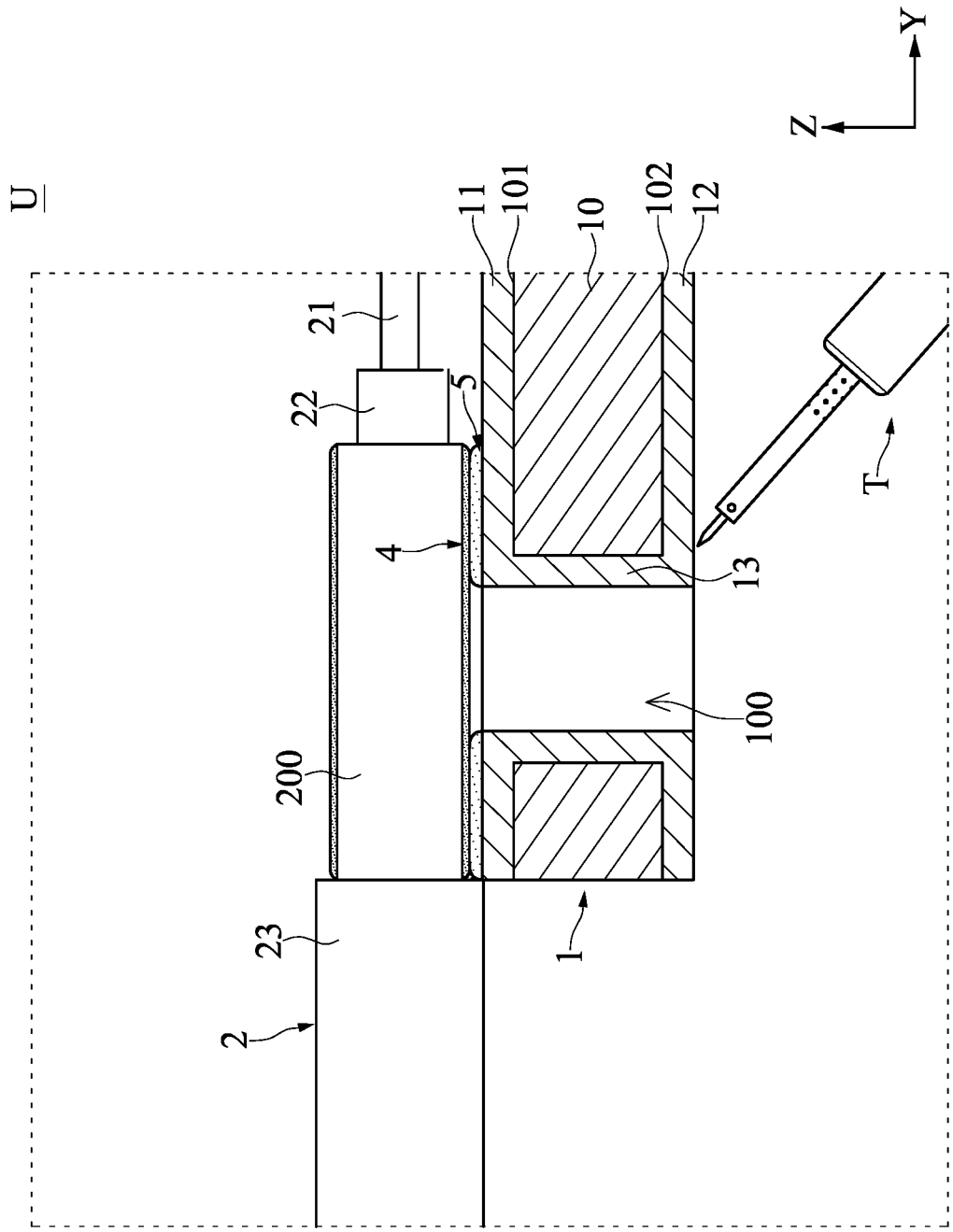
FIG. 14 is a cross-sectional view of another aspect of the wire soldered structure according to the second embodiment of the present disclosure.

Referring to FIG. 13 and FIG. 14, an exploded cross-sectional view of the wire and the substrate of another aspect of the wire soldered structure according to a second embodiment of the present disclosure, and a cross-sectional view of another aspect of the wire soldered structure according to the second embodiment of the present disclosure are shown. Comparing FIG. 14 with FIG. 7, the biggest different between the second embodiment and the first embodiment of the present disclosure resides in that the preset solder 3 is not required in the second embodiment. Instead, the soldered torch T is used to melt a preset solder for bonding the substrate 1 and the wire 2. Specifically, the second embodiment of the present disclosure provides the wire soldered structure U that includes a substrate 1, a wire 2 and a preset solder (the first preset solder 4 and/or the second preset solder 5). The substrate 1 includes a main body 10, a first conducting layer 11 disposed on the main body 10, a second conducting layer 12 disposed on the main body 10 and opposite to the first conducting layer 11, a through hole 100 extending through the main body 10 and the first conducting layer 11, and a third conducting layer 13 that is disposed in the through hole 100 and that is connected between the first conducting layer 11 and the second conducting layer 12. The wire 2 includes a soldered portion 200 that is disposed on the first conducting layer 11 and that is adjacent to the through hole 100. It should be noted that the structural features and the corresponding positions of the substrate 1 and the wire 2 of the wire soldered structure U provided by the second embodiment are similar to those recited in the first embodiment, and detailed description thereof will thus be omitted for sake of brevity.

As mentioned above, referring back to FIG. 13, compared with the first embodiment that uses the solder 3 for bonding soldered portion 200 of the wire 2 to the first conducting layer 11 of the substrate 1, the wire soldered structure U provided by the second embodiment further includes the preset solder (the first preset solder 4 and/or the second preset solder 5). The preset solder can be disposed on at least one of the soldered portion 200 of the wire 2 and the first conducting layer 11 of the substrate 1. The soldered portion 200 of the wire 2 can be bonded to the first conducting layer 11 of the substrate 1 via the preset solder 3.

As mentioned above, referring back to FIG. 13 and FIG. 14, the wire soldered structure U is illustrated herein to include the preset solder (the first preset solder 4) and another preset solder (the second preset solder 5). Specifically, the first preset solder 4 can be disposed on the soldered portion 200 of the wire 2, and the second preset solder 5 can be disposed on the first conducting layer 11 of the substrate 1. The first preset solder 4 and the second preset solder 5 are disposed between the soldered portion 200 of the wire 2 and the first conducting layer 11 of the substrate 1. The second preset solder 5 can be pressed against the first preset solder 4. As a result, by virtue of configuration of the first conducting layer 11, the second conducting layer 12, the third conducting layer 13 and the through hole 100, when the soldered torch T is provided to press against the second conducting layer 12 or the third conducting layer 13, the heat generated by the soldered torch T can be sequentially conducted through the second conducting layer 12 or the third conducting layer 13, and to the first conducting layer 11. Therefore, at least one of the first preset solder 4 disposed on the soldered portion 200 of the wire 2 and the second preset solder 5 disposed on the first conducting layer 11 of the substrate 1 can be heated and melted. As a result, after the melted first preset solder 4 and/or the second preset solder 5 are solidified, the first conducting layer 11 of the substrate 1 can be bonded to the soldered portion 200 of the wire 2.

It should be noted that although the aspect shown in FIG. 13 and FIG. 14 includes the first preset solder 4 and the second preset solder 5, the first preset solder 4 and the second preset solder 5 can be selectively disposed in other embodiments of the present disclosure. Further, the structural features of the first preset solder 4 and the second preset solder 5 are similar to those recited in the aforesaid embodiment, and detailed description thereof will thus be omitted for sake of brevity.

As mentioned above, in terms of the soldered method of the wire soldered structure according to the second embodiment of the present disclosure, a substrate 1 provided with the through hole 100 thereon and a wire 2 can be provided. A preset solder (the first preset solder 4 and/or the second preset solder 5) is disposed on at least one of the soldered portion 200 of the wire 2 and the first conducting layer 11 of the substrate 1. Further, the soldered portion 200 is disposed to correspond to the through hole 100. Finally, the soldered torch T is used to heat the second conducting layer 12 or the third conducting layer 13 such that the heat generated by the soldered torch T can be sequentially conducted to and melt the preset solder, thereby bonding the soldered portion 200 to the first conducting layer 11.

Figure 15:
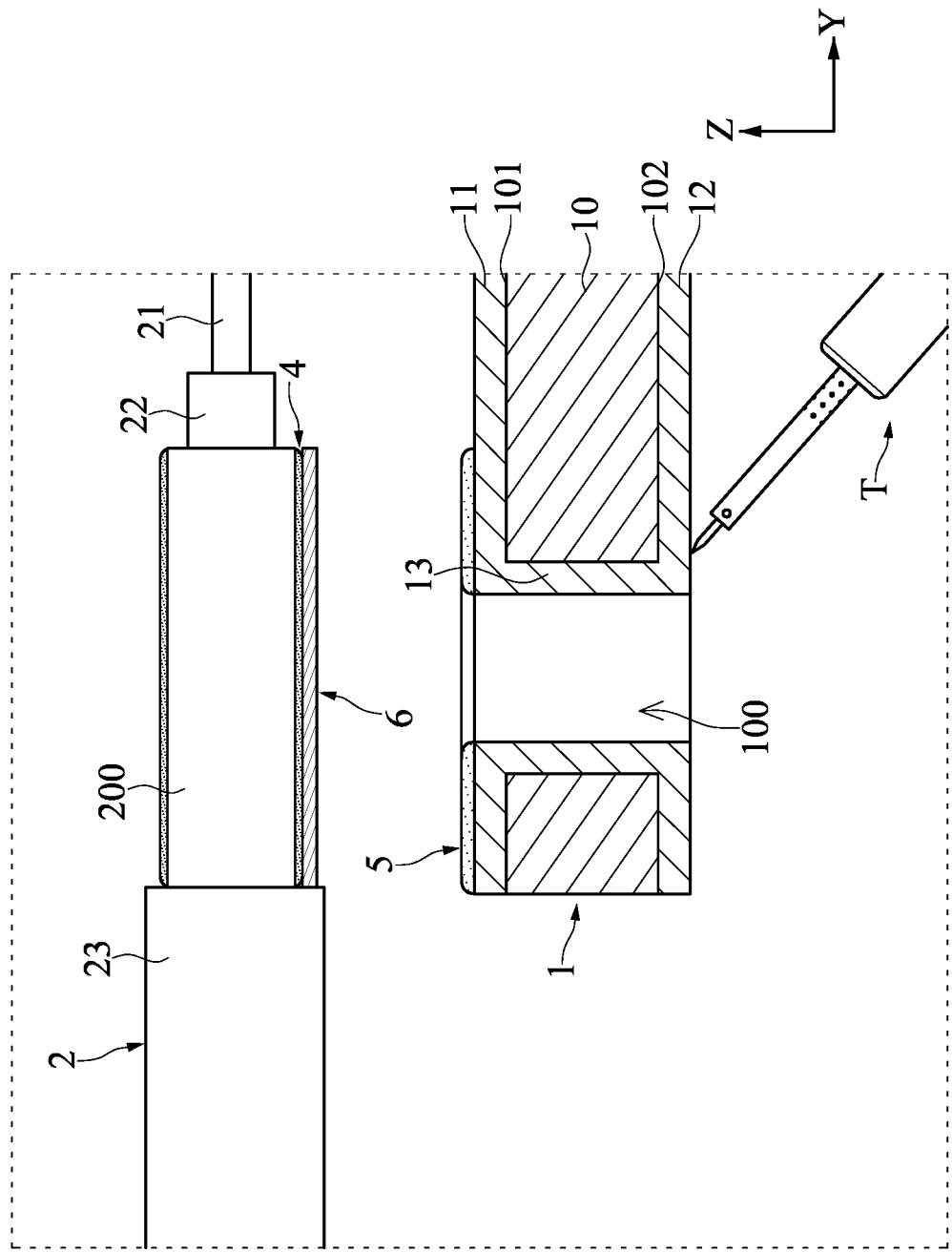
FIG. 15 is an exploded cross-sectional view of the wire and the substrate of yet another aspect of the wire soldered structure according to the second embodiment of the present disclosure.
Figure 16:
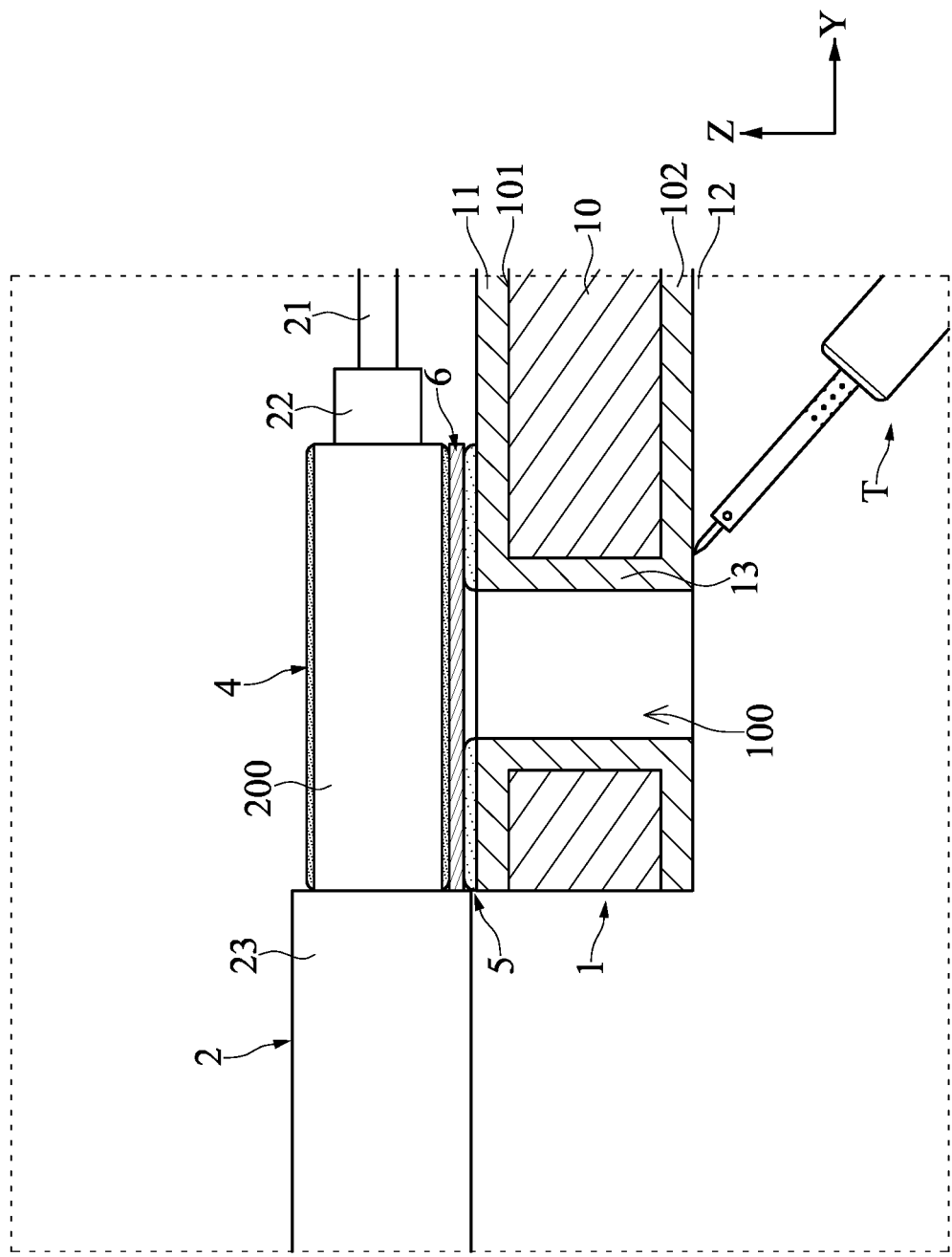
FIG. 16 is a cross-sectional view of yet another aspect of the wire soldered structure according to the second embodiment of the present disclosure.

After that, referring to FIG. 15 and FIG. 16, an exploded cross-sectional view of the wire and the substrate of yet another aspect of the wire soldered structure according to the second embodiment of the present disclosure and a cross-sectional view of yet another aspect of the wire soldered structure according to the second embodiment of the present disclosure are shown. Comparing FIG. 15 with FIG. 13, in the aspect shown in FIG. 15 and FIG. 16, the wire soldered structure U can further include a conductive plate 6. The preset solder (the first preset solder 4) can be disposed on the soldered portion 200 of the wire 2. The first preset solder 4 can be disposed between the soldered portion 200 of the wire 2 and the conductive plate 6, such that the conductive plate 6 can be bonded to the soldered portion 200 of the wire 2 via the first preset solder 4. In other words, by configuring the first preset solder 4 on the soldered portion 200 of the wire 2, the conductive plate 6 can be bonded to the soldered portion 200 of one or more of the wires 2.

Then, another preset solder (the second preset solder 5) can be disposed on the first conducting layer 11 of the substrate 1. When pressing the soldered torch T against the second conducting layer 12 or the third conducting layer 13, the heat generated by the soldered torch T can be sequentially conducted through the second conducting layer 12 or the third conducting layer 13, and to the first conducting layer 11. Therefore, the second preset solder 5 disposed on the first conducting layer 11 of the substrate 1 can also be heated and melted. As a result, after the melted second preset solder 5 is solidified, the first conducting layer 11 of the substrate 1 can be bonded to the conductive plate 6 via the second preset solder 5. Thus, the wire 2 can be soldered to the substrate 1 via the conductive plate 6. Furthermore, the structural features of the conductive plate 6 is similar to those recited in the aforesaid embodiment, and detailed description thereof will thus be omitted for sake of brevity In conclusion, one of the beneficial effects of the present disclosure is that: by virtue of the features of "the soldered portion 200 of the wire 2 is disposed on the first conducting layer 11 and adjacent to the through hole 100" and "the soldered portion 200 of the wire 2 is soldered to the first conducting layer 11 of the substrate 1 via the solder 3 or the preset solder 3" of the wire soldered structure U provided by the present disclosure, the reliability of the soldered effect between the wires 2 and the substrate 1 can be substantially increased.

Moreover, by virtue of configuration of the conductive plate 6, the soldered portion 200 of the wire 2 can be protected from being continuously heated and being damaged. Meanwhile, the conductive plate 6 can locate a position of the wire 2 with respect to the substrate 1.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wire soldered structure, comprising:
 a substrate including a main body, a first conducting layer disposed on the main body, and a through hole extending through the main body and the first conducting layer;
 a wire including:
  an inner conductor;
  an insulating layer covering the inner conductor; and
  a soldered portion covering the insulating layer and disposed on the first conducting layer and that is adjacent to the through hole; and
 a solder disposed in the through hole;

wherein the soldered portion of the wire is soldered to the first conducting layer of the substrate via the solder to bond the wire on the substrate.

2. The wire soldered structure according to claim 1, wherein a longitudinal direction of the soldered portion of the wire is perpendicular to an extending direction of the through hole.

3. The wire soldered structure according to claim 2, wherein the main body of the substrate includes a first surface, the first conducting layer is disposed on the first surface, and a projection of the soldered portion of the wire on the first surface of the substrate at least partially overlaps with a projection of the through hole on the first surface of the substrate.

4. The wire soldered structure according to claim 1, wherein the main body of the substrate includes a first surface, the first conducting layer is disposed on the first surface, and a projection of the soldered portion of the wire on the first surface of the substrate at least partially overlaps with a projection of the through hole on the first surface of the substrate.

5. The wire soldered structure according to claim 1, wherein the substrate further includes a second conducting layer, and a third conducting layer that is disposed in the through hole and that is connected between the first conducting layer and the second conducting layer, wherein the main body of the substrate includes a first surface and a second surface opposite to the first surface, the first conducting layer is disposed on the first surface, and the second conducting layer is disposed on the second surface, wherein the solder is disposed on the third conducting layer in the through hole.

6. The wire soldered structure according to claim 1, wherein the through hole has a predetermined diameter, a center of the wire is spaced apart from a center of another wire by a spaced distance, wherein the predetermined diameter and the spaced distance satisfy the following equation: $0.7P \leq W \leq 1.6P$, in which P is a length of the spaced distance, and W is the predetermined diameter.

7. The wire soldered structure according to claim 1, further comprising another wire including another soldered portion that is disposed on the first conducting layer, wherein the through hole is formed between the soldered portion of the wire and the another soldered portion of the another wire.

8. The wire soldered structure according to claim 1, further comprising: a preset solder, the preset solder being disposed on at least one of the soldered portion of the wire and the first conducting layer of the substrate.

9. The wire soldered structure according to claim 1, further comprising: a preset solder and a conductive plate, wherein the preset solder is disposed on the soldered portion of the wire, and the soldered portion of the wire is soldered to the conductive plate via the solder.

10. A wire soldered structure, comprising:
a substrate including a main body, a first conducting layer disposed on the main body, a second conducting layer disposed on the main body and opposite to the first conducting layer, a through hole extending through the main body and the first conducting layer, and a third conducting layer that is disposed on an inner surface of the through hole and that is connected between the first conducting layer and the second conducting layer;
a wire including:
an inner conductor;
an insulating layer covering the inner conductor; and
a soldered portion covering the insulating layer and disposed on the first conducting layer and that is adjacent to the through hole; and
a preset solder disposed on at least one of the soldered portion of the wire and the first conducting layer of the substrate;
wherein the soldered portion of the wire is soldered to the first conducting layer of the substrate via the preset solder to bond the wire on the substrate.

11. The wire soldered structure according to claim 10, wherein a longitudinal direction of the soldered portion of the wire is perpendicular to an extending direction of the through hole.

12. The wire soldered structure according to claim 11, wherein the main body of the substrate includes a first surface, the first conducting layer is disposed on the first surface, and a projection of the soldered portion of the wire on the first surface of the substrate at least partially overlaps with a projection of the through hole on the first surface of the substrate.

13. The wire soldered structure according to claim 10, wherein the main body of the substrate includes a first surface, the first conducting layer is disposed on the first surface, and a projection of the soldered portion of the wire on the first surface of the substrate at least partially overlaps with a projection of the through hole on the first surface of the substrate.

14. The wire soldered structure according to claim 10, wherein the through hole has a predetermined length of a diameter, a center of the wire is spaced apart from a center of another wire by a spaced distance, wherein the predetermined diameter and the spaced distance satisfy the following equation: $0.7P \leq W \leq 1.6P$, in which P is a length of the spaced distance, and W is the predetermined diameter.

15. The wire soldered structure according to claim 10, further comprising another wire including another soldered portion that is disposed on the first conducting layer, wherein the through hole is formed between the soldered portion of the wire and the another soldered portion of the another wire.

16. The wire soldered structure according to claim 10, further comprising: another preset solder, wherein the preset solder is disposed on the soldered portion of the wire, and the another preset solder is disposed on the first conducting layer of the substrate.

17. The wire soldered structure according to claim 10, further comprising: a conductive plate and another preset solder, wherein the preset solder is disposed on the soldered portion of the wire, and the soldered portion of the wire is soldered to the conductive plate via the preset solder, wherein the another preset solder is disposed on the first conducting layer of the substrate, and the first conducting layer of the substrate is soldered to the conductive plate via the another preset solder.

* * * * *